US006977128B2

(12) United States Patent
Boulin et al.

(10) Patent No.: US 6,977,128 B2
(45) Date of Patent: Dec. 20, 2005

(54) MULTI-LAYERED SEMICONDUCTOR STRUCTURE

(75) Inventors: David M. Boulin, Lebanon, NJ (US); Reginald C. Farrow, Somerset, NJ (US); Isik C. Kizilyalli, Millburn, NJ (US); Nace Layadi, Singapore (SG); Masis Mkrtchyan, Gillette, NJ (US)

(73) Assignee: Agere Systems Inc., Allentown, PA (US)

( * ) Notice: Subject to any disclaimer, the term of this patent is extended or adjusted under 35 U.S.C. 154(b) by 27 days.

(21) Appl. No.: 10/704,449

(22) Filed: Nov. 7, 2003

(65) Prior Publication Data

US 2004/0094847 A1 May 20, 2004

Related U.S. Application Data

(60) Continuation of application No. 09/867,202, filed on May 29, 2001, now Pat. No. 6,706,609, which is a division of application No. 09/456,224, filed on Dec. 7, 1999, now Pat. No. 6,576,529.

(51) Int. Cl.[7] ............................. G03F 9/00; G03C 5/00
(52) U.S. Cl. ............................ 430/5; 430/22; 430/296; 430/942; 257/797; 438/11; 438/401; 438/975
(58) Field of Search .............................. 430/5, 22, 296, 430/942; 257/797; 438/11, 401, 975

(56) References Cited

U.S. PATENT DOCUMENTS

| | | | |
|---|---|---|---|
| 4,073,990 A | 2/1978 | Friedrich |
| 4,109,029 A | 8/1978 | Ozdemir et al. |
| 4,118,230 A | 10/1978 | Binder |
| 4,123,661 A | 10/1978 | Wolf et al. |
| 4,487,653 A | 12/1984 | Hatcher |
| 4,503,334 A | 3/1985 | King et al. |
| 4,868,138 A | 9/1989 | Chan et al. |
| 5,004,925 A | 4/1991 | Takahashi et al. |
| 5,128,283 A | 7/1992 | Tanaka |
| 5,334,466 A | 8/1994 | Yasui et al. |
| 5,382,498 A | 1/1995 | Berger |
| 5,663,568 A | 9/1997 | Waskiewicz |
| 5,824,441 A | 10/1998 | Farrow et al. |
| 5,852,497 A | 12/1998 | Pramanik et al. |
| 5,863,825 A | 1/1999 | Pasch et al. |
| 5,866,913 A | 2/1999 | Robinson |
| 5,906,902 A | 5/1999 | Farrow |
| 5,963,816 A | 10/1999 | Wang et al. |
| 6,132,910 A | 10/2000 | Kojima |
| 6,232,040 B1 | 5/2001 | Katsap et al. |
| 6,261,726 B1 | 7/2001 | Brooks et al. |
| 6,313,542 B1 | 11/2001 | Pramanik et al. |
| 6,323,500 B1 | 11/2001 | Yamashita |
| 6,352,922 B1 | 3/2002 | Kim |
| 6,555,183 B2 | 4/2003 | Wang et al. |
| 6,706,609 B2 * | 3/2004 | Boulin et al. ............... 438/401 |

FOREIGN PATENT DOCUMENTS

| | | |
|---|---|---|
| EP | 0669636 A1 | 2/1995 |
| JP | 6-252025 | 9/1994 |
| KR | 1998-077550 | 11/1998 |

OTHER PUBLICATIONS

Farrow et al., "Marks for alignment and registration in projection lithography", J. Vac. Sci. Technol. B, 11(6), Nov./Dec. 1993, pp. 2175-2178.

Farrow et al., "Mark detection for alignment and registration in a high-throughput projection electron lithography tool", J. Vac. Sci. Technol. B., 10(6), Nov./Dec. 1992, pp. 2780-2783.

R.C. Farrow et al., "Alignment Mark Detection in CMOS Materials with SCALPEL E-Beam Lithography", Proc. SPIE-Int. Soc. Opt. Eng. vol. 3676, Pt. 1-2, pp. 217-226, Mar. 1999.

R.C Farrow et al., "CMOS Compatible Alignment Marks for the SCALPEL Proof of Lithography Tool", Microelectronic Engineering, vol. 46, Issues 1-4, pp. 263-266, May 1999.

Yamamoto et al., "Novel alignment method for planarized substrates in electron beam lithography", Jul. 1999, Microprocesses and Nanotechnology Conference, 1999, pp. 222-223.

M.D. Naeem, W.A. Orr-Arienzo, J.G. Rapp; "Effect of Ti deposition temperature on TiSix resistivity"; Appl. Phys. Lett.; 1995; p. 877-878.

H.S. Kwon, B.J. Hwang, W.S. Cho, C.S. Chang, S.B. Kim, Y. Park, H. Ihm, J.K. Park, H.S. Kang, J.H. Jeong, J.B. Park, Y.C. Jang, S.M. Jung, Kinam Kim; "Suppression of CoSix Induced Leakage Current using Novel Capping Process for Sub-0.10um node SRAM Cell technology".

"Executive Millenium Report: 1999 Roadmap: Solutions and caveats"; http://cgw.pennnet.com/Articles/Article_Display.cfm?Section=Archives&Subsection=Display&ARTICLE_ID=72939&KEYWORD=low-k.

Y.S. Suh, D.G. Park, S.A. Jang, S.H. Lee, T.K. Kim, I.S. Yeo, S.D. Kim, C.T. Kim; "Retarded C54 transformation and suppressed agglomeration by precipitates in TiSi2 films"; Journal of Applied Physics Mar. 15, 2000; vol. 87, No. 6.

* cited by examiner

Primary Examiner—Christopher G. Young

(57) ABSTRACT

A multi-layered semiconductor structure having an alignment feature for aligning a lithography mask and that may be used in connection with a SCALPEL tool. The present invention is particularly well-suited for sub-micron CMOS technology devices and circuits, but is not limited thereto. The present invention advantageously permits use of an electron beam source for both alignment and exposure of a lithography mask on a semiconductor wafer. The present invention also advantageously enables the formation of an alignment feature early (i.e., zero-level) in the semiconductor device fabrication process.

19 Claims, 4 Drawing Sheets

MULTI-LAYERED SEMICONDUCTOR STRUCTURE

CROSS REFERENCE INFORMATION

This application is a continuation of U.S. application Ser. No. 09/867,202, filed May 29, 2001, which is now U.S. Pat. No. 6,706,609, issued on Mar. 16, 2004, which was a divisional of U.S. application Ser. No. 09/456,224, filed on Dec. 7, 1999, which is now U.S. Pat. No. 6,576,529, issued on Jun. 10, 2003, both of which are incorporated by reference herein.

FIELD OF THE INVENTION

The present invention relates to integrated circuits and, more particularly, to a method of forming an alignment feature in or on a multi-layered semiconductor structure for aligning a lithography mask and that may be used in connection with a SCALPEL tool.

BACKGROUND OF THE INVENTION

Optical lithography tools use a single light source (e.g., a laser) to align and expose a lithography mask on a semiconductor wafer. In a typical semiconductor wafer process that uses photolithography, alignment marks do not generate a high backscattered electron contrast when probed with the electron beam in an electron beam lithography exposure tool. Therefore, detection of typical photolithography alignment marks using an electron beam with SCALPEL (Scattering with Angular Limitation In Projection Electron-Beam Lithography) is not possible. Only after alignment marks are defined on or in the wafer, that can be detected with electrons, can a SCALPEL tool be used to expose the mask features on the wafer. Thus the SCALPEL tool uses an electron beam source to align the lithography mask, and an electron beam source to expose the mask on the wafer.

There, thus, exists a need in the art for a method and structure that permits the use of an electron-beam source for both alignment and exposure of a lithography mask on a semiconductor wafer.

SUMMARY OF THE INVENTION

The present invention is directed to a method of forming an alignment feature in or on a multi-layered semiconductor structure for aligning a lithography mask and that may be used in connection with a Scattering with Angular Limitation In Projection Electron-Beam Lithography (SCALPEL) tool and process. The present invention is particularly well-suited for sub-micron CMOS technology devices and circuits, but is not limited thereto. The present invention advantageously permits use of an electron beam source for both alignment and exposure of a lithography mask on a semiconductor wafer. The present invention also advantageously enables the formation of an alignment feature early (i.e., zero-level) in the semiconductor device fabrication process.

A SCALPEL tool uses alignment features for, inter alia, lithography mask alignment and registration. Residual errors introduced during fabrication of a multi-layered semiconductor structure may be minimized by using the same electron optical configuration (i.e., electron optical energy source) for alignment of a lithography mask and for exposure of the mask features on the semiconductor structure, i.e., in an electron beam sensitive resist on the structure, for example.

Alignment features or marks are fabricated on a semiconductor structure (i.e., wafer) for aligning a lithography mask to the structure; the lithography mask defining a plurality of features to be exposed and etched in the semiconductor structure. In accordance with the present invention, a 100 kV electron beam source may be used by a SCALPEL tool for both the alignment of a lithography mask and exposure of the features defined by the mask. Forming an alignment feature in the semiconductor structure of a relatively high atomic number material provides a material that will backscatter electrons which may be detected by the SCALPEL tool to determine the location of the alignment feature. Moreover, the present invention further provides for use of a single energy source in a SCALPEL tool where the alignment feature is formed of silicon dioxide and defined in a layer of the semiconductor structure. In that case, the detection sensitivity of the SCALPEL tool must be greater than for high atomic number materials or the mark topography must contribute sufficient backscattered electron contrast so that the subtle differences in the amount of the electrons reflected by the silicon dioxide alignment feature and by other semiconductor layers may be detected.

The present invention also generally applies to a method of aligning a lithography mask on a semiconductor structure using an alignment feature formed in or on the structure and of a material that back-scatters a greater amount of electrons than any of the other materials from which the semiconductor structure is constructed. An electron beam is directed at the structure and the electrons back-scattered by the alignment feature may be detected to determine the location of the alignment feature. A lithography mask may then be aligned for exposure using the alignment feature previously detected.

The present invention is directed to a method of forming a multi-layered semiconductor structure having a silicon substrate, and comprises forming an alignment feature of a material that is not silicon in the silicon substrate and aligning a lithography mask using the alignment feature and using a SCALPEL tool having an electron beam source for directing an electron beam toward the silicon substrate. The alignment feature back-scatters a greater amount of electrons toward the electron beam source than the silicon substrate.

The present invention is also directed to a method of forming a multi-layered semiconductor structure consisting of layers of silicon, silicon dioxide, and polysilicon, and comprises forming an alignment feature on the polysilicon layer of the semiconductor structure, and aligning a lithography mask using the alignment feature and using a SCALPEL tool having an electron beam source for directing an electron beam toward the polysilicon layer. The alignment feature back-scatters a greater amount of electrons toward the electron beam source (toward an electron beam sensitive detector) than the polysilicon layer.

The present invention is further directed to a method of forming a multi-layered semiconductor structure consisting of layers of silicon and silicon dioxide, and comprises forming an alignment feature in the silicon dioxide, and aligning a lithography mask using the alignment feature and using a SCALPEL tool having an electron beam source for directing an electron beam toward the silicon substrate. The alignment feature back-scatters a greater amount of electrons toward the electron beam source than the polysilicon layer.

The present invention is also directed to a semiconductor structure constructed in accordance with the various method embodiments of the present invention.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference characters denote similar elements throughout the several views.

DETAILED DESCRIPTION OF THE PRESENTLY PREFERRED EMBODIMENTS

Figure 8:
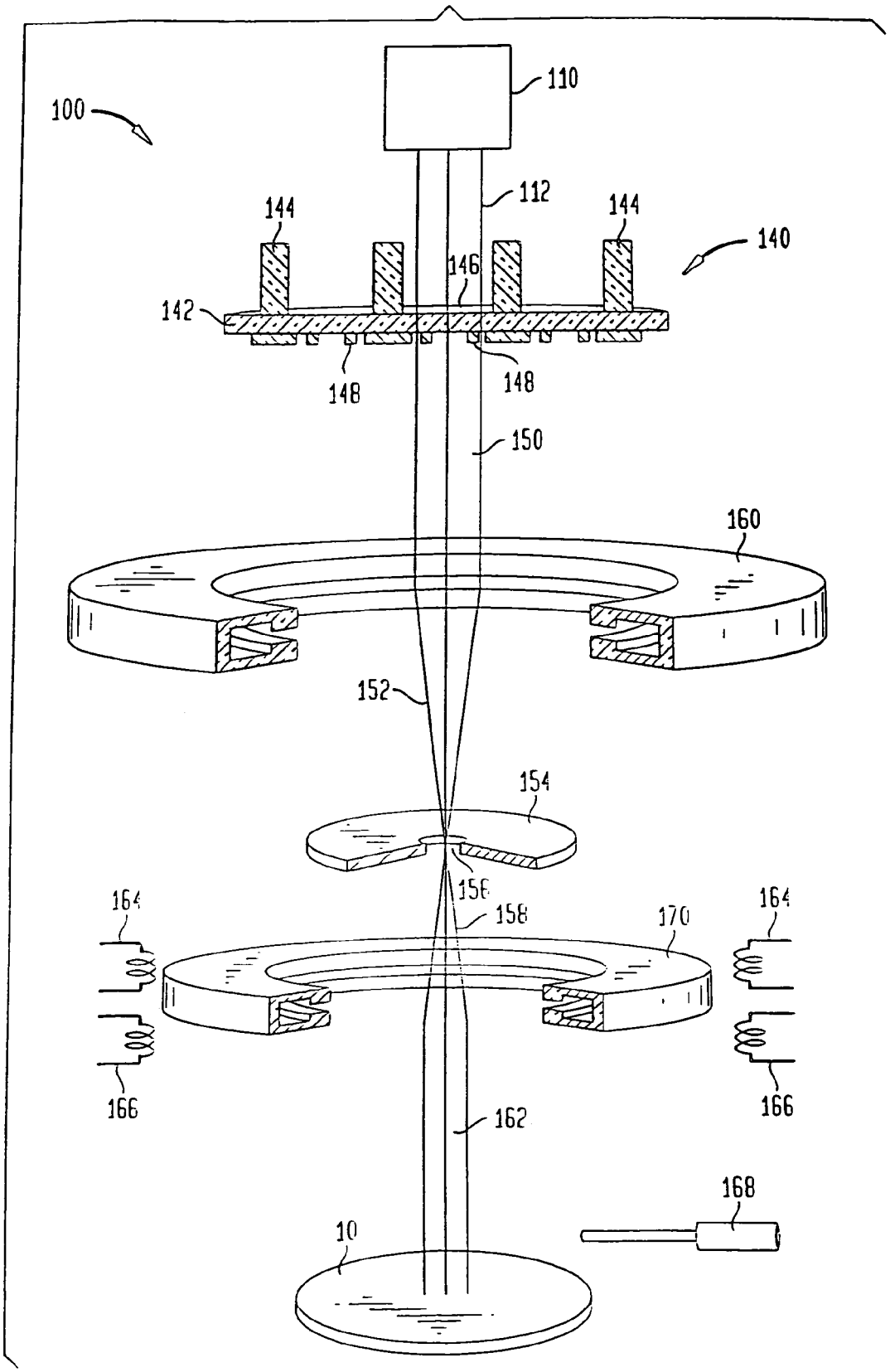
FIG. 8 is a schematic diagram of a SCALPEL exposure tool that includes a SCALPEL aperture.

Referring now to the drawings in detail, and with reference first to FIG. 8, a SCALPEL proof-of-concept (SPOC) or a SCALPEL proof-of-lithography (SPOL) exposure tool 100 is there depicted. Such an exposure tool 100 is generally known to persons skilled in the art and a detailed discussion of its configuration and operation is deemed unnecessary for the present invention. The following description is thus provided as an illustrative, non-limiting example of part of an exemplary exposure tool 100. The exposure tool 100 depicted in FIG. 8 includes an electron beam source 110 for generating an electron beam 112, preferably, approximately a 100 kV beam, and for directing that beam through various components (e.g., mask, lenses, apertures, etc.) and toward the semiconductor structure 10. The electron beam 112 is first directed through a mask 140 that includes a membrane 142 that is supported by a plurality of struts 144. The mask 140 is illuminated by the electron beam 112 within a segment 146 that may contain a pattern such as, for example, an alignment feature 60, to be etched in a semiconductor structure or wafer 10, and that is etched in a scatterer layer 148. The electron beam 150 that has passed through the mask 140 has been scattered by the membrane 142 and scatterer layer 148 (which contains the pattern). The rays of the scattered electron beam 150 are focused by a first lens 160 into focused rays 152 and then directed through an aperture 154 defining sufficient acceptance 156 to filter the focused rays 152 such that filtered rays 158 only contain rays that did not pass through the scatterer layer 148. A second lens 170 focuses the filtered rays 158 into image rays 162, which contain contrast representative of the pattern defined by the scatterer layer 148 (e.g., an alignment feature 60), and directs the focused rays 170 onto the surface of the wafer 10. Deflectors 164, 166 are provided to scan the pattern carried by the focused rays 152 onto the wafer 10 while an electron beam sensitive detector 168 is provided to detect backscattered electrons. A signal derived from the detector 168 may be analyzed using known detection circuits and systems to determine a relationship between the image of the mask mark and the wafer mark for alignment purposes. The backscattered electrons are detected by the detector 168 to identify and locate the alignment feature 60 and to facilitate alignment of the lithography mask 140.

As used herein, the terms semiconductor structure and wafer are used interchangeably and refer to a device comprised of a single layer of semiconductor material (e.g., a silicon substrate, GaAs, InP and other group III and group V compounds, and silicon on insulator substrates (e.g., $SiGe_x$)) and also to a device comprised of more than a single layer of semiconductor material.

Figure 9:
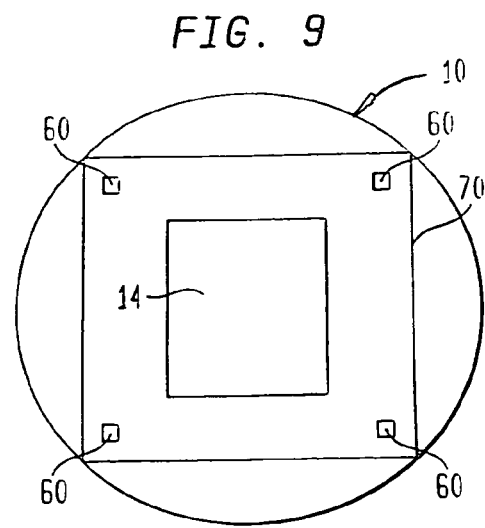
FIG. 9 is a top view of a semiconductor structure having a plurality of alignment features defined thereon or therein in accordance with the present invention.

In accordance with the various embodiments of the present invention, an alignment feature 60, depicted in FIG. 9, is defined in or in a multi-layered semiconductor structure 10 (i.e., wafer) and may be formed of a material different than the material from which the semiconductor substrate is formed (e.g., silicon), and preferably, of a material having a relatively high atomic number, as compared with the atomic number of the semiconductor material (e.g., silicon). The alignment feature 60 will thus back-scatter more electrons than the semiconductor substrate 20. A contrast of approximately 5% or more between the alignment feature 60 and the semiconductor substrate 20 is sufficient to distinguish between the two. In this manner, the electron beam source 110 may be used to locate an alignment feature 60, align the lithography mask 140, and expose the features defined by the mask 140 in the resist (i.e., e-beam resist) on the semiconductor structure 10 during fabrication of an integrated circuit 14. Exemplary alignment feature materials include, but are not limited to, $SiO_2$, W, WSi, Ta, TaSi, Ti, WSiN, TaN, WN, TiN, Co, $CoSi_x$, and $TiSi_x$.

Figure 1:
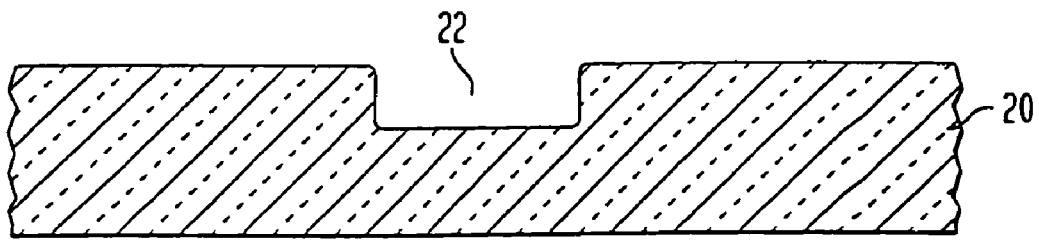
FIGS. 1–3 are cross-sectional side views of a silicon substrate of a semiconductor structure having an alignment feature formed therein and constructed in accordance with the present invention.
Figure 2:
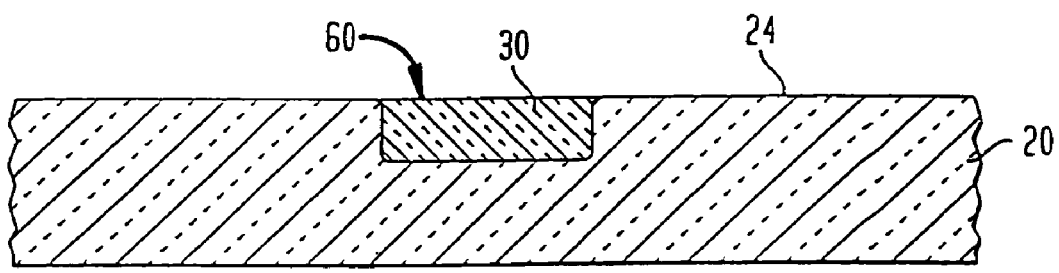
Figure 3:
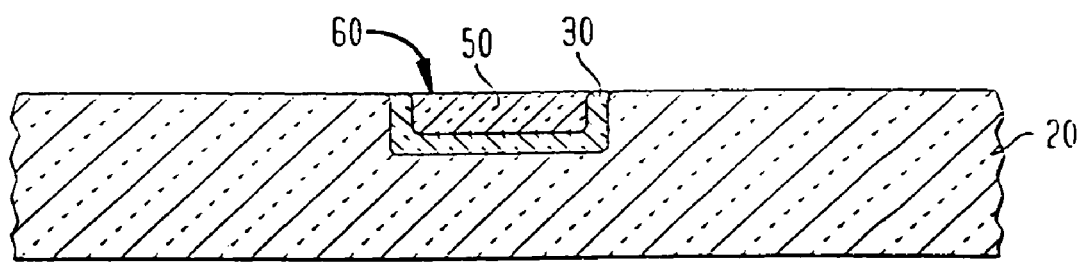

Referring next to FIGS. 1–3, a part of a semiconductor substrate 20 is there depicted in cross-section and having a shallow trench 22 defined therein. Exemplary semiconductor materials for the substrate include, but are not limited to, silicon (Si), galium-arsenide (GaAs), Indium Phosphide (InP), other group III and group V compounds, and silicon on insulator substrate (e.g., $SiGe_x$). The trench 22 may be formed or etched to a depth of approximately 0.1–1.0 micrometers using known semiconductor processing techniques. Silicon dioxide 30 is deposited in the trench 22 using chemical vapor deposition (CVD) techniques or thermally grown, or other art-recognized material deposition methods and techniques, until the trench 22 is substantially full. Subsequent processing such as, for example, chemical mechanical polishing, may be performed on the substrate 20 and silicon dioxide material 30 to form a substantially smooth and planar top surface 24. In one embodiment, the silicon dioxide 30 forms the alignment feature 60. The SCALPEL exposure tool 100 for use in connection with the present invention must be capable of distinguishing between the amount of electron back-scatter from the substrate 20 and the amount from the silicon dioxide 30. Operations performed on the semiconductor substrate or wafer 10 at this stage of the fabrication process are typically referred to as zero-level operations. Forming an alignment feature 60 as a zero-level operation thus permits the use of the SCALPEL process and tools earlier on the wafer 10 fabrication process, which results in a higher degree of precision for the features and structures subsequently formed in the semiconductor structure or wafer 10 using that process, and in the integrated circuit 14 formed thereby.

In an alternative embodiment depicted in FIG. 3, part of the silicon dioxide 30, between approximately 25 Å and 8000 Å, is removed by etching, for example, thereby defining another trench that is subsequently filled with a material 50 having an atomic number higher than the atomic number of silicon, thus forming an alignment feature 60 in the substrate 20 (in the silicon dioxide 30).

Figure 4:
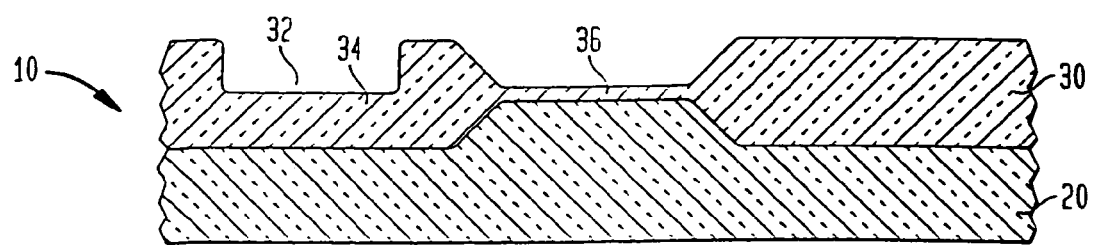
FIGS. 4–5 are cross-sectional side views of the silicon and silicon dioxide layers of a semiconductor structure having an alignment feature formed in the silicon dioxide layer from a relatively high atomic number material and constructed in accordance with the present invention.
Figure 5:
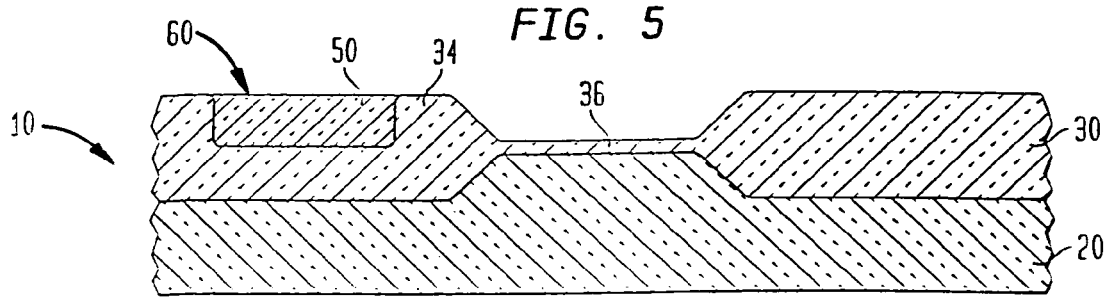

Referring next to FIGS. 4–5, a semiconductor structure 10 comprised of a semiconductor substrate 20 and a silicon dioxide layer 30 adjacently disposed thereabove is depicted. A field-oxide region 34 and a gate-oxide region 36 are defined in the silicon dioxide layer 30. Using art-recognized techniques, a shallow trench 32 is formed in the silicon dioxide layer 30 above the field-oxide region 34 to a depth of between approximately 100 Å, 10,000 Å, depending, at least in part, on the sensitivity of the detector 168 of the exposure tool 100. A material 50 having an atomic number higher than the atomic number of the semiconductor material from which the substrate is formed is then deposited in the shallow trench 32, thus forming an alignment feature 60 in a region above the field-oxide region 34 of the silicon dioxide layer 30.

Figure 6:
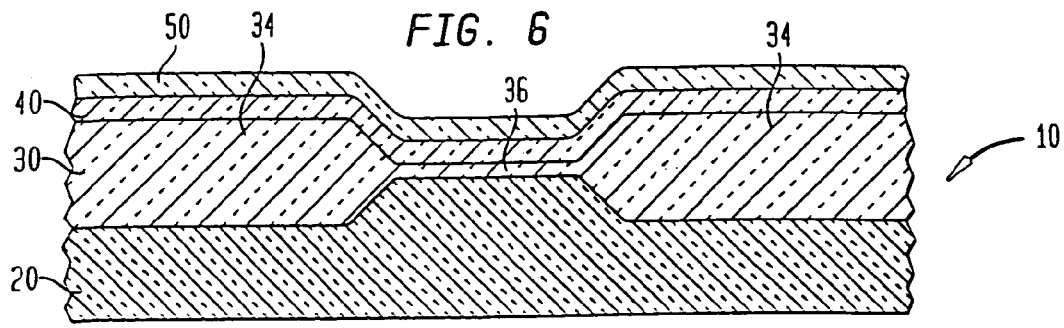
FIGS. 6–7 are cross-sectional side views of the silicon, silicon dioxide, and polysilicon layers of a semiconductor structure having an alignment feature formed on the polysilicon layer from a relatively high atomic number material and constructed in accordance with the present invention.
Figure 7:
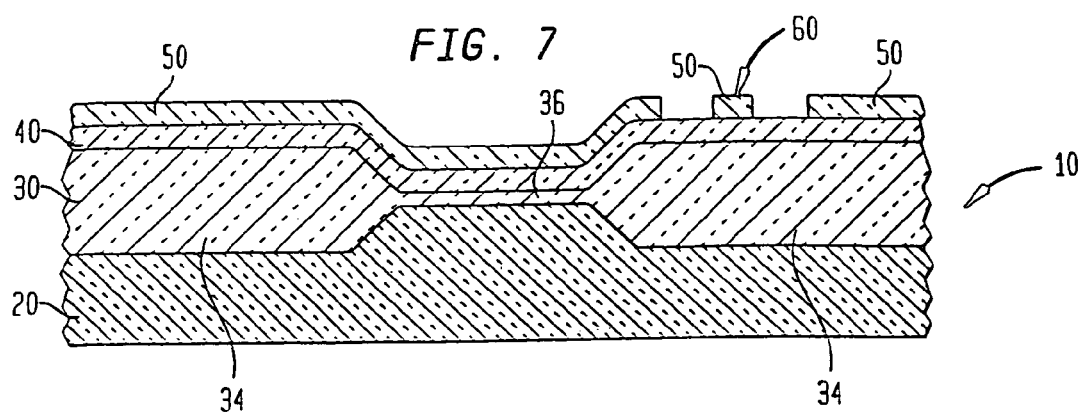

In another embodiment of the present invention, depicted in FIGS. 6 and 7, a multi-layered semiconductor structure 10 includes a semiconductor substrate 20, a silicon dioxide layer 30 disposed adjacent to and above the semiconductor substrate 20, and a polysilicon layer 40 disposed adjacent to and above the dioxide layer 30. A field-oxide region 34 and a gate-oxide region 36 are separately defined in the silicon dioxide layer 30. A layer of a material 50 having an atomic number greater than the atomic number of the substrate material is deposited in blanket fashion over the polysilicon layer 40. Using art recognized techniques and methods, some of the relatively high atomic number material 50 is removed to change the thickness of that material 50, thereby defining an alignment feature 60. The amount of material removed depends, in part, on the sensitivity of the SCALPEL tool 100 (in particular, of the detector provided in the SCALPEL tool 100) and on the ability of the tool 100 to detect the differing amounts of electrons back-scattered by the different thickness relatively high atomic number material 50. As depicted in FIG. 7, enough material 50 may be removed to expose the polysilicon layer 40 beneath the material 50, although less material 50 may also be removed in accordance with the present invention, i.e. a detent (not shown) may be formed in the material 50 by removal only of a small portion thereof. Removal of some of the material 50 defines an alignment feature 60 in portions of the remaining relatively high atomic number material 50. The SCALPEL tool 100 will detect differences in back-scattering as the electron beam 112 is caused to pass alternatively over the relatively high atomic number material 50 and the polysilicon layer 40 (or over the parts of the material 50 having different thicknesses). The alignment feature 60 may be defined over the field-oxide region 34, over the gate-oxide region 36, or over both, as a routine matter of design choice.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A multi-layered semiconductor structure comprising a layer of a semiconductor material, a layer of silicon dioxide, and a layer of polysilicon, said multi-layered semiconductor structure constructed by a method comprising the steps of:
   (a) forming an alignment feature on the polysilicon layer of the semiconductor structure; and
   (b) aligning a lithography mask using the alignment feature formed in said step (a) using a SCALPEL tool having an electron beam source for directing an electron beam toward the polysilicon layer, the alignment feature back-scattering a greater amount of electrons toward the electron beam source than the polysilicon layer.

2. A multi-layered semiconductor structure as recited by claim 1, wherein said step (a) comprises:
   depositing a back-scatter material on the polysilicon layer of the semiconductor structure, said back-scatter material having a higher atomic number than the semiconductor material; and
   selectively removing some of the back-scatter material to change its thickness thereby defining an alignment feature in the back-scatter material.

3. A multi-layered semiconductor structure as recited by claim 2, wherein said removing step comprises selectively removing portions of the back-scatter material to expose the polysilicon layer, thereby defining an alignment feature in at least part of the back-scatter material not removed.

4. A multi-layered semiconductor structure as recited by claim 2, wherein said depositing step comprises depositing the back-scatter material selected from a group of materials consisting of W, WSi, Ta, TaSi, Ti, WSiN, TaN, WN, TiN, Co, $CoSi_x$, and $TiSi_x$.

5. A multi-layered semiconductor structure as recited by claim 2, wherein the semiconductor structure has defined therein a field-oxide region and wherein said removing step comprises selectively removing some of the back-scatter material above the field-oxide region.

6. A multi-layered semiconductor structure as recited by claim 2, wherein the semiconductor structure has defined therein a gate-oxide region and wherein said removing step comprises selectively removing some of the back-scatter material above the gate-oxide region.

7. A multi-layered semiconductor structure comprising layers of semiconductor material and silicon dioxide formed by:
   (a) forming an alignment feature in the silicon dioxide layer by forming a shallow trench in the silicon dioxide layer and depositing a back-scatter material in the shallow trench, said back-scatter material having a higher atomic number than the semiconductor material; and
   (b) aligning a lithography mask using the alignment feature formed in said step (a) using a SCALPEL tool having an electron beam source for directing an electron beam toward the silicon dioxide layer, the alignment feature back-scattering a greater amount of electrons toward the electron beam source than the silicon dioxide layer.

8. A multi-layered semiconductor structure as recited by claim 7, wherein said forming step comprises forming a trench having a depth of between approximately 100 Å and 10,000 Å in the silicon dioxide.

9. A multi-layered semiconductor structure as recited by claim 7, wherein said depositing step comprises depositing a back-scatter material selected from a group of materials consisting of W, WSi, Ta, TaSi, Ti, WSiN, TaN, WN, TiN, Co, CoSi$_x$, and TiSi$_x$.

10. An aligned lithography mask formed by a method comprising the steps of:
   (a) forming an alignment feature in or on a semiconductor structure, the alignment feature being formed of a semiconductor material having an electron back-scatter characteristic such that the alignment feature back-scatters a different amount of electrons than the semiconductor structure in the presence of an electron beam, wherein the semiconductor structure includes a semiconductor substrate and wherein the alignment feature is formed by forming a shallow trench in the semiconductor substrate and depositing silicon dioxide in the shallow trench;
   (b) directing an electron beam at the semiconductor structure;
   (c) determining the location of the alignment feature by detecting electrons back-scattered from the alignment feature; and
   (d) aligning a lithography mask using the alignment feature based on the location determined in said step (c).

11. An aligned lithography mask as recited by claim 10, wherein the semiconductor structure includes a semiconductor substrate, and wherein said step (a) comprises:
   forming a shallow trench in the semiconductor substrate;
   depositing silicon dioxide in the shallow trench;
   forming a shallow trench in the silicon dioxide by removing part of the silicon dioxide deposited in the shallow trench; and
   depositing a back-scatter material in the shallow trench formed in the silicon dioxide, said back-scatter material having a higher atomic number than the semiconductor material.

12. An aligned lithography mask as recited by claim 10, wherein the semiconductor structure includes a layer of semiconductor material, a layer of silicon dioxide, and a layer of polysilicon, and wherein said step (a) comprises:
   depositing a back-scatter material on the polysilicon layer of the semiconductor structure, said back-scatter material having a higher atomic number than the semiconductor material; and
   selectively removing some of the back-scatter material to change its thickness thereby defining an alignment feature in the back-scatter material.

13. An aligned lithography mask as recited by claim 10, wherein the semiconductor structure includes a layer of semiconductor material and a layer of silicon dioxide, and wherein said step (a) comprises:
   forming a shallow trench in the silicon dioxide; and
   depositing a back-scatter material in the shallow trench, said back-scatter material having a higher atomic number than the semiconductor material.

14. A multi-layered semiconductor structure comprising a layer of a semiconductor material, a layer of silicon dioxide, and a layer of polysilicon, said multi-layered semiconductor structure constructed by a method comprising the steps of:
   (a) forming an alignment feature on the polysilicon layer of the semiconductor structure; and
   (b) aligning a lithography mask using the alignment feature formed in said step (a) using an EPL tool having an electron beam source for directing an electron beam toward the polysilicon layer, the alignment feature back-scattering a greater amount of electrons toward the electron beam source than the polysilicon layer.

15. A multi-layered semiconductor structure as recited by claim 14, wherein said step (a) comprises:
   depositing a back-scatter material on the polysilicon layer of the semiconductor structure, said back-scatter material having a higher atomic number than the semiconductor material; and
   selectively removing some of the back-scatter material to change its thickness thereby defining an alignment feature in the back-scatter material.

16. A multi-layered semiconductor structure as recited by claim 15, wherein said removing step comprises selectively removing portions of the back-scatter material to expose the polysilicon layer, thereby defining an alignment feature in at least part of the back-scatter material not removed.

17. A multi-layered semiconductor structure as recited by claim 15, wherein said depositing step comprises depositing the back-scatter material selected from a group of materials consisting of W, WSi, Ta, TaSi, Ti, WSiN, TaN, WN, TiN, Co, CoSi$_x$, and TiSi$_x$.

18. A multi-layered semiconductor structure as recited by claim 15, wherein the semiconductor structure has defined therein a field-oxide region and wherein said removing step comprises selectively removing some of the back-scatter material above the field-oxide region.

19. A multi-layered semiconductor structure as recited by claim 15, wherein the semiconductor structure has defined therein a gate-oxide region and wherein said removing step comprises selectively removing some of the back-scatter material above the gate-oxide region.

* * * * *